United States Patent [19]

Sato et al.

[11] Patent Number: 6,150,068
[45] Date of Patent: *Nov. 21, 2000

[54] PHOTOSENSITIVE RESIN COMPOSITION FOR FAR-ULTRAVIOLET EXPOSURE

[75] Inventors: Kenichiro Sato; Kunihiko Kodama; Kazuya Uenishi; Toshiaki Aoai, all of Shizuoka, Japan

[73] Assignee: Fuji Photo Film Co., Ltd., Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/911,165

[22] Filed: Aug. 14, 1997

[30] Foreign Application Priority Data

Aug. 15, 1996 [JP] Japan .................... 8-215731

[51] Int. Cl.⁷ ...................................... B03F 7/004
[52] U.S. Cl. ................... 430/270.1; 430/920; 430/326
[58] Field of Search .................. 430/270.1, 326, 430/945, 908, 920, 921, 285.1

[56] References Cited

U.S. PATENT DOCUMENTS

| | | | |
|---|---|---|---|
| 5,272,042 | 12/1993 | Allen et al. | 430/270 |
| 5,621,019 | 4/1997 | Nakano et al. | 522/49 |
| 5,665,518 | 9/1997 | Maeda et al. | 430/270.1 |
| 5,731,125 | 3/1998 | Yamachika et al. | 430/270.1 |
| 5,981,140 | 11/1999 | Sato et al. | 430/270.1 |
| 5,985,511 | 11/1999 | Yako et al. | 430/270.1 |
| 5,994,022 | 11/1999 | Tanabe et al. | 430/170 |

FOREIGN PATENT DOCUMENTS

| | | |
|---|---|---|
| 0564389 | 10/1994 | European Pat. Off. . |
| 0632327 | 1/1995 | European Pat. Off. . |
| 0709736 | 5/1996 | European Pat. Off. . |
| 0726500 | 8/1996 | European Pat. Off. . |
| 4410441 | 9/1995 | Germany . |

*Primary Examiner*—Janet Baxter
*Assistant Examiner*—Rosemary Ashton
*Attorney, Agent, or Firm*—Sughrue, Mion, Zinn Macpeak & Seas, PLLC

[57] ABSTRACT

A photosensitive resin composition for far-ultraviolet exposure of from 170 to 220 nm, which comprises an N-hydroxymaleinimide-type sulfonate photo acid generator having a specific structure and a resin having a substituent capable of increasing the solubility to an alkali developer by an acid, and a pattern forming method using the photosensitive resin composition. The photosensitive resin composition has a high transparency to light having a wavelength of from 170 to 220 nm and is excellent in the photocomposition property and the acid generating efficiency.

3 Claims, No Drawings

PHOTOSENSITIVE RESIN COMPOSITION FOR FAR-ULTRAVIOLET EXPOSURE

FIELD OF THE INVENTION

The present invention relates to a photosensitive resin composition suitable in the case of exposing to light of a very short wavelength of from 170 to 220 nm and to a pattern-forming method using it.

BACKGROUND OF THE INVENTION

In the field of producing various kinds of electronic devices requiring fine working such as a semiconductor element, the demand for increasing the density and the integration of devices has been increased more and more. With the demand, the required performance for the photographic techniques for realizing fining of patterns becomes extremely severe. The technique of playing a part of the fining techniques is the increase of the high resolving power of a photoresist and also is shortening the wavelength of the exposure light.

In general, the resolution (Res) in an optical system can be expressed by the Rayleigh's equation, that is Res=k·$\lambda$/NA (wherein k is a process factor, $\lambda$ is a wavelength of the exposure light source, and NA is a numerical aperture of a lens). From the equation, it can be seen that for more fining the reproduced line width and resolving fine patterns (that is, for obtaining a high resolving power), the wavelength at exposure may be shortened. Certainly, with the reduction of the smallest reproduced line width, the exposure wavelength is shifted to the g ray (436 nm) and the i ray (365 nm) of a high-pressure mercury lamp, and further, the production of devices using a KrF excimer laser (248 nm) has been investigated. Also, for finer working, the utilization of shorter excimer laser, in particular, ArF excimer laser (193 nm) has been promising.

On the other hand, when a photoresist which is exposed with the light of a short wavelength is watched, the increase of the high integration by not a single layer resist conventionally produced but by double layer or more multilayer resist system utilizing a surface lithography has been investigated. However, there is yet a problem about the complication of process which has hitherto hindered the practical use of a multilayer resist.

Also, in the case of an excimer laser such as a KrF excimer laser, because the life of the gas is short and the exposure apparatus itself is expensive, it is generally considered to be necessary to increase the cost performance of laser.

In response to the necessity, there is a so-called chemical amplification-type resist which becomes the main current from the use for the KrF excimer laser exposure. The chemical amplification resist has a mechanism that an acid is generated from a photo acid generator existing in the system in a catalytic amount by a light exposure, by the catalytic amount of the acid, the protective group of an alkali-soluble group of a binder or a low molecular compound is released as in catalytic reaction and the discrimination of the solubility to an alkali developer is secured. Because the chemical amplification-type resist catalytic reactively utilizes the acid generated by a photoreaction, the increase of the sensitivity can be expected.

The greater part of the photoresists for the excimer laser exposure under development at present are the chemical amplification-type resists and this is also applied to the application for an ArF excimer laser having an exposure wavelength of 220 nm or shorter.

Now, the largest theme in the photoresist system corresponding to a stepper having exposure wavelengths of from 170 to 220 nm aimed at by the present invention is securing of the transparency of the resist film to the wavelength of the exposed light. The quinonediazido series compound which is used in the case of the g ray (436 nm) and the i ray (365 nm) of a high-pressure mercury lamp as the exposure light has a property of reducing the absorption to the wavelength of the exposed light by the light exposure, that is, has a light bleaching property, and thus the absorption by the film before the light exposure does not give a problem as at present. On the other hand, in the case of the chemical amplification-type resist, because the resist does not have such a light bleaching property, when the light absorption before light exposure is high, a large difference of the light intensity occurs between the surface of the film and the bottom portion of the resist and as the result thereof, a high resolving property is not obtained. Thus, in the case of the chemical amplification-type resist, the transparency of the resist film before light exposure is regarded as important.

In the case of planning a transparent material to a light having a wavelength of 220 nm or shorter, first, it is said that the use of aromatic compounds conventionally used as materials for positive resists is difficult. For example, even novolac resins and further polyhydroxystyrene which are conventionally frequently used as binders have a high absorption to the light of the wavelength of 220 nm or lower. Accordingly, for a lithography utilizing the exposing light wavelength of 220 nm or shorter, these materials cannot be used.

The above thing is also applied to the other material, the photo acid generator. For example, in *SPIE Proceedings*, pages 422–431, Vol.2438 (1995), it is reported that the added amount of the triphenylsulfonium salt-type light acid generating agent, which is frequently used in the resists for the KrF excimer laser, is limited because of a large light absorption in a vacuum ultraviolet region. On the other hand, it is reported that among the aromatic series compounds, naphthalene has a very small light absorption to the ArF excimer laser (exposure wavelength: 193 nm), e.g., in *J. Photopolym. Sci. Technol.*, pages 423–432, Vol. 7 (1994), and *SPIE Proceedings*, pages 445–454, Vol. 2438 (1995).

That is, in the aromatic series materials which are generally considered to be unusable in the lithography utilizing the light for exposure having a wavelength of 220 nm or shorter, it can be said that usable materials exist.

Also, in regard to the photo acid generators not having an aromatic substituent in the molecule and the small absorbance to the light having a wavelength of 220 nm or shorter, for example, the photo acid generator represented by following formula is reported in JP-A-7-199467, JP-A-7-252324, and JP-A-8-12626 (the term "JP-A" as used herein means an "unexamined published Japanese Patent Application");

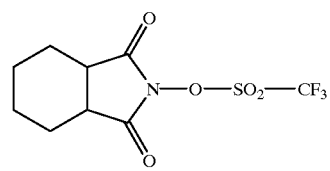

However, the photo acid generator is unsatisfactory on the photodecomposition property, i.e., the acid generating efficiency, which is another important property for the photo acid generator.

As described above, in the lithography utilizing the light for exposure having a wavelength of 220 nm or shorter, such as the ArF excimer laser, systematic investigations of the photo acid generator have not yet been made and thus it is very difficult to anticipate the relation of the structure and the light absorption. Furthermore, it can be said that there are no knowledge about the transparency and photodecomposition property or the acid generating efficiency to an exposed light.

That is, the means of obtaining a photo acid generator having a high transparency to an exposure light, satisfying the photodecomposition property or the acid generating efficiency to the exposure light, and being usable in the lithography utilizing the exposure light having a wavelength of from 170 to 220 nm, which is aimed in the present invention, have hitherto been entirely not known.

SUMMARY OF THE INVENTION

Accordingly, an object of the present invention is to provide a photosensitive resin composition for far-ultraviolet exposure having a high transparency to an exposure light having a wavelength of from 170 to 220 nm, satisfactory photodecomposition property and acid generating efficiency to the exposure light, and being usable in the lithography utilizing the exposure light having a wavelength of from 170 to 220 nm.

Another object of the present invention is to provide a pattern forming method suitable for the lithography utilizing the exposure light having a wavelength of from 170 to 220 nm.

As the result of various investigations taking into consideration of the above-described various characteristics, the inventors have discovered that the above objects can be achieved by using the N-hydroxymaleinimide-type sulfonate photo acid generator represented by following formula (I) as the photo acid generator and have attained the present invention based on the knowledge.

That is, the above-described objects are achieved by the present invention as described hereinbelow.

(1) A photosensitive resin composition for far-ultraviolet exposure of from 170 to 220 nm comprising an N-hydroxymaleinimide-type sulfonate photo acid generator represented by following formula (I) and a resin having a substituent capable of increasing the solubility in an alkali developer by an acid;

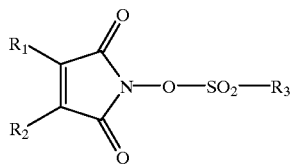

wherein $R_1$ and $R_2$, which may be the same or different, each represents a hydrogen atom, an alkyl group having from 1 to 6 carbon atoms, or a cycloalkyl group having not more than 6 carbon atoms; $R_1$ and $R_2$ may combine via an alkylene chain to form a ring; and $R_3$ represents an alkyl group, a perfluoroalkyl group, a cyclic alkyl group, or a camphor group.

(2) A pattern forming method in which patterning is effected by forming a thin film of the photosensitive resin composition described in above (1), light-exposing the thin film with a light having a wavelength of from 170 to 220 nm, and effecting development.

(3) The pattern forming method described in above (2), wherein a source for the light exposure is an ArF excimer laser.

DETAILED DESCRIPTION OF THE INVENTION

The present invention is described in detail below.

The groups represented by $R_1$ and $R_2$ in formula (I) are described below. Examples of the alkyl group having from 1 to 6 carbon atoms include methyl, ethyl, propyl, isopropyl, n-butyl, isobutyl, tert-butyl, n-pentyl, and n-hexyl. In these alkyl groups, methyl, ethyl, and propyl are preferred and methyl and ethyl are more preferred. Examples of the cycloalkyl group having not more than 6 carbon atoms include cyclopropyl, cyclopentyl and cyclohexyl. In these groups, cyclopentyl and cyclohexyl are preferred. As the case of forming a ring by combining $R_1$ and $R_2$ via an alkylene chain, there are the cases of forming, for example, a cyclohexyl group, a norboryl group, and a tricyclodecanyl group.

The group represented by $R_3$ is described below. Examples of the alkyl group include a straight chain alkyl group having from 1 to 20 carbon atoms such as methyl, ethyl and propyl, and a branched alkyl group having from 1 to 20 carbon atoms such as isopropyl, isobutyl, tert-butyl and neopentyl. In these alkyl groups, straight chain or branched alkyl groups having from 1 to 16 carbon atoms are preferred and straight chain or branched alkyl groups having from 4 to 15 carbon atoms are more preferred. Examples of the perfluoroalkyl group includes a straight chain perfluoroalkyl group having from 1 to 20 carbon atoms such as trifluoromethyl and pentafluoroethyl, and a branched perfluoroalkyl group having from 1 to 20 carbon atoms such as heptafluoroisopropyl and nonafluoro tert-butyl. In these groups, straight chain or branched perfluoroalkyl groups having from 1 to 16 carbon atoms are preferred. Examples of the cyclic alkyl group includes a single cyclic alkyl group such as cyclopentyl and cyclohexyl and a plural cyclic alkyl group such as decalyl, norbornyl and tricyclodecanyl. The camphor group as $R_3$ means the group as shown in Compound I-9 exemplified later.

Examples of the compound represented by formula (I) are shown below but the compounds of formula (I) are not limited to these compounds.

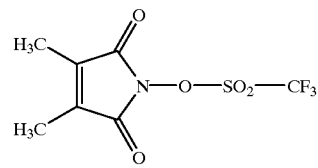
[I-1]

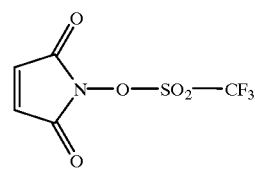
[I-2]

[I-3] 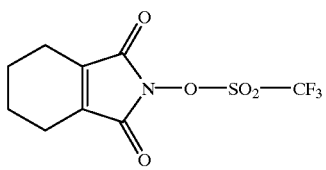

[I-4] 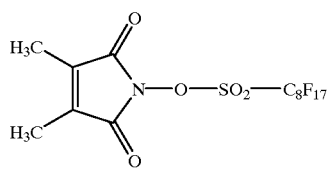

[I-5] 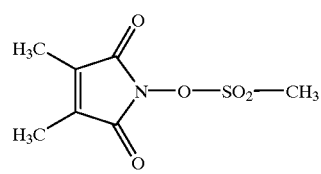

[I-6] 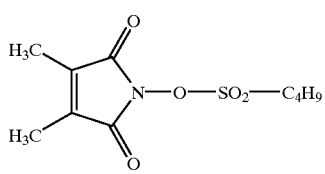

[I-7] 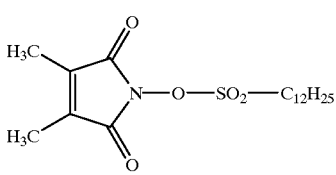

[I-8] 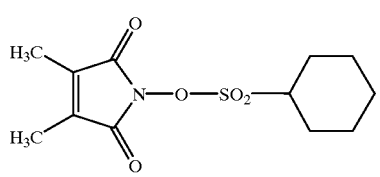

[I-9] 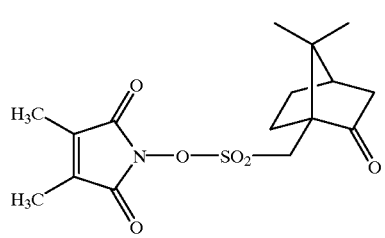

[I-10] 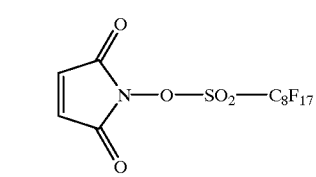

[I-11] 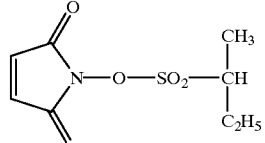

[I-12] 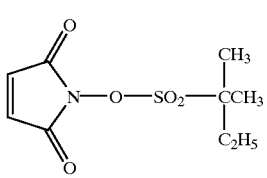

The compound represented by formula (I) described above can be synthesized by reacting the N-hydroxyimide compound synthesized according to the method of G. F. Jaubert, *Ber.*, 28, 360(1895), the method of D. E. Ames et al., *J. Chem. Soc.*, 3518 (1955), or the method of M. A. Stolberg, et al., *J. Am. Chem. Soc.*, 79, 2615(1957) and sulfonic acid chloride under a basic condition, for example, according to the method of L. Bauer, et al., *J. Org. Chem.*, 24, 1294, (1959).

The content of the compound represented by formula (I) thus synthesized in the photosensitive resin composition is preferably from 0.1 to 20% by weight, more preferably from 0.5 to 15% by weight, and most preferably from 1 to 10% by weight based on the total solid components.

In the present invention, the photo acid generators shown below may be used in combination with the N-hydroxymaleinimide-type sulfonate represented by formula (I). However, in the case of using these photo acid generators in combination with the photo acid generator of the present invention, the ratio thereof is the equivalent or less, preferably 75% or less, and more preferably 50% or less by molar ratio to the photo acid generator of the present invention. If the other photo acid generator is used in an amount of more than the equimolar amount, the effect of the present invention is not obtained.

The photo acid generators which can be used in combination with the photo acid generator of the present invention include, for example, the aliphatic alkylsulfonium salts such as β-oxocyclohexylmethyl(2-norbonyl)sulfonium, trifluoromethane sulfonate, cyclohexylmethyl(β-oxocyclohexyl) sulfonium, trifluoromethane sulfonate, and N-hydroxysuccinimide sulfonates as described in JP-A-7-25846, JP-A-7-28237, JP-A-7-92675, and JP-A-8-27102; and further the sulfonium salt represented by following formula (II), the disulfones represented by following formula (III), and the compounds represented by following formula (IV) described in *J. Photopolym. Sci. Technol.*, Vol. 7, No. 3, 423(1994).

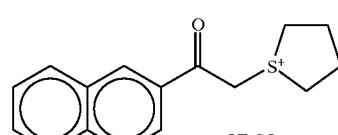

(II)

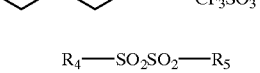

(III)

-continued $$R_6-SO_2-\underset{N_2}{C}-SO_2-R_7 \quad (IV)$$

wherein $R_4$ to $R_7$, which may be the same or different, each represents an alkyl group or a cyclic alkyl group.

Furthermore, the following generally known photo acid generators may be used in combination, as long as the content thereof is very small. In the case of using the following general photo acid generator, the content thereof must be 2% by weight or less, and more preferably 1% by weight or less based on the total solid components.

Such photo acid generators include, for example, the diazonium salts described in S. I. Schlesinger, *Photogr. Sci. Eng.*, 18, 387(1974), T. S. Bal et al., *Polymer,* 21, 423(1980); the ammonium salts described in U.S. Pat. Nos. 4,069,055, 4,069,056, and Re 27,992, and Japanese Patent Application No. 3-140,140; phosphonium salts described in D. C. Necker et al., *Macromoleules,* 17, 2468(1984), C. S. Wen et al., *The. Proc. Conf. Rad. Curing ASIA,* page 478, Tokyo, Oct. (1988), and U.S. Pat. Nos. 4,069,055 and 4,069,056; the iodonium salts described in J. V. Crivello et al., *Macromorecules,* 10(6), 1307(1977), *Chem. & Eng. News,* Nov. 28, 31(1988), European Patent 104,143, U.S. Pat. Nos. 339,049 and 410,201, JP-A-2-150848, and JP-A-2-296,514; the sulfonium salts described in J. V. Crivello et al., *Polymer J.,* 17, 73(1985), J. V. Crivello et al., *J. Org. Chem.,* 43, 3055(1978), W. R. Watt et al., *J.Polymer Sci.,* Polymer Chem. Ed., 22, 1789(1984), J. V. Crivello et al., *Polymer Bull.,* 14, 279(1985), J. V. Crivello et al, *Macromorecules,* 14(5), 1141(1981), J. V. Crivello et al., *J. Polymer Sci.,* Polymer Chem. Ed., 17, 2877(1979), European Patents 370,693, 3,902,114, 233,567, 297,443, and 297,442, U.S. Pat. Nos. 4,933,377, 4,161,811, 4,410,201, 4,339,049, 4,760,013, 4,734,444, and 2,833,827, and German Patents 2,904,626, 3,604,580 and 3,604,581; the selenonium salts described in J. V. Crivello et al, *Macromorecules,* 10(6), 1307(1977), and J. V. Crivello et al, *J. Polymer Sci.,* Polymer Chem. Ed., 17, 1047(1979); the onium salts such as arsonium salts, described in C. S. Wen et al, *Teh. Proc. Conf. Rad. Curing ASIA,* page 478, Tokyo, Oct. (1988); the organic halogen compounds described in U.S. Pat. No. 3,905,815, JP-B-46-4605 (the term "JP-B" as used herein means an "examined published Japanese patent application"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organic metals/organic halide compounds described in K. Meier et al., *J. Rad. Curing,* 13(4), 26(1986), T. P. Gill, et al., *Inorg. Chem.,* 19, 3007(1980), D. Astruc, *Acc. Chem. Res.,* 19(12), 377(1896), and JP-A-2-161445; the photo acid generators having an o-nitrobenzyl-type protective group described in S. Hayase et al., *J. Polymer Sci.,* 25, 753(1987), E. Reichmanis et al, *J. Polymer Sci.,* Polymer Chem. Ed., 2 3, 1(1985), Q. Q. Zhu et al., *J. Photochem.,* 36, 85, 39, 317(1987), B. Amit et al., *Tetrahedron Lett.,* (24 , 2205(1973), D. H. R. Barton et al.,*J. Chem. Soc.,* 3571(1965), P. M. Collins et al.,*J. Chem. Soc.,* Perkinl, 1695(1975), M. Rudinstein et al., *Tetrahedron Lett.,* (17), 1445(1975), J. W. Walker et al., *J. Am. Chem. Soc.,* 110, 7170(1988), S. C. Busman et al.,*J. Imaging Technol.,* 11(4), 191(1985), H. M. Houlihan et al., *Macromolecules,* 21, 2001(1988), P. M. Collins et al., *J. Chem. Soc., Chem. Commun.,* 532(1972), S. Hayase et al., *Macromolcules.* 18, 1799(1985), E. Reinchmanis et al., *J. Elecrochem. Soc.,* Solid State Sci. Technol., 130(6), F. M. Houlihan et al., *Macromolecules,* 21, 2001(1988), European Patents 0290, 750, 046,083, 156,535, 271,851, and 0,388,343, U.S. Pat. Nos. 3,901,710 and 4,181,531, JP-A-60-198538, and JP-A-53-133022; the compounds generating sulfonic acid by causing photodecomposition, such as imino sulfonate, described in M. Tunooka et al, *Polymer Preprints, Japan,* 35(8), G. Berner et al., *J. Rad, Curing,* 13(4), W. J. Mijs et al., *Coating Technol.,* 55(697), 45(1983), Akzo, H. Adachi et al., *Polymer Preprints, Japan,* 37(3), European Patents 0199,672, 84,515, 199,672, 044,115, and 0101,122, U.S. Pat. Nos. 618,564, 4,371,605, and 4,431,774, JP-A-64-18143, JP-A-2-245756, and Japanese Patent Application No. 3-140109; and the disulfone compounds described in JP-A-61-166544.

Also, the compounds having introduced the group or the compound generating an acid by a light into the main chain or the side chain thereof, for example, the compounds described in M. E. Woodhouse et al.,*J. Am. Chem. Soc.,* 104, 5586(1982), S. P. Pappas et al., *J. Imaging Sci.,* 30(5), 218(1986), S. Kondo et al, *Makromol. Chem.,* Rapid Commun., 9, 625(1988), Y. Yamada et al., *Makromol. Chem.,* 152, 153, 163(1972), J. V. Crivello et al.,*J. Polymer Sci., Polymer Chem. Ed.* 17, 3845(1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029, can be used.

Furthermore, the compounds generating an acid by light described in V. N. R. Pillai, *Synthesis,* (1) 1(1980), A. Abad et al., *Tetrahedron Lett.,* (47), 4555(1971), D. H. R. Barton et al., *J. Chem. Soc.,* (C), 329(1970), U.S. Pat. No. 3,779, 778, and European Patent 126,712, can be also used.

Furthermore, the following photo acid generators can be exemplified.

(1) The oxazole derivatives represented by following formula (PAG 1) and the S-triazine derivatives represented by following formula (PAG 2) shown below each substituted by a trihalomethyl group.

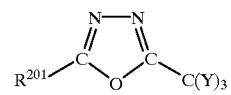

(PAG 1)

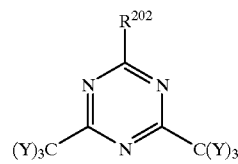

(PAG 2)

wherein, $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group, or $-C(Y)_3$; and Y represents a chlorine atom or a bromine atom.

Specific examples of the above-described compounds are shown below but the compounds shown by the above formulae are not limited to these compounds.

(PAG1-1)
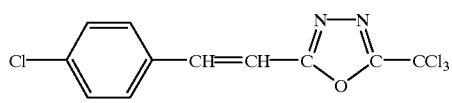
(PAG1-2)
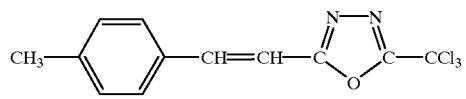
(PAG1-3)
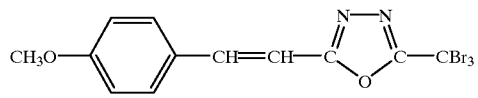
(PAG1-4)
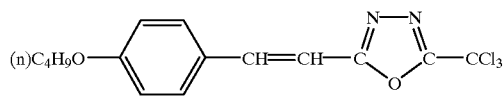
(PAG1-5)
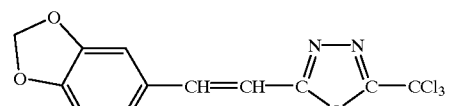
(PAG1-6)
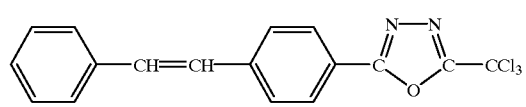
(PAG1-7)
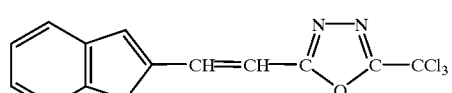
(PAG1-8)
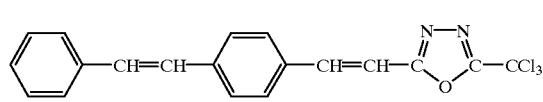
(PAG2-1)
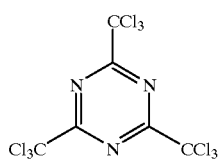
(PAG2-2)
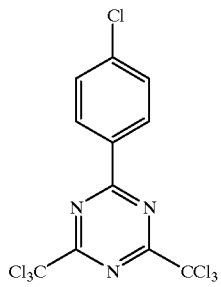
(PAG2-3)
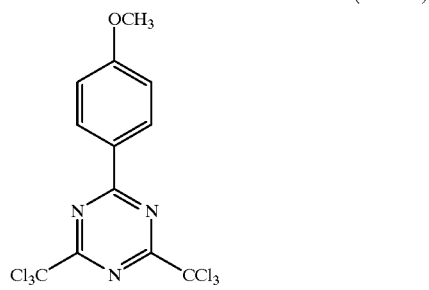
(PAG2-4)
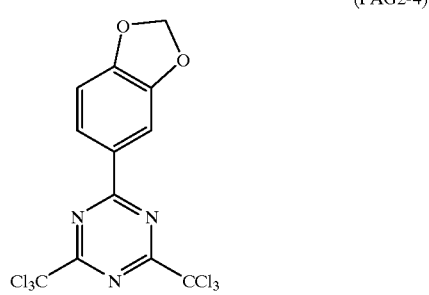
(PAG2-5)
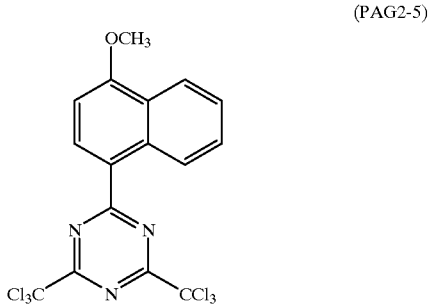
(PAG2-6)
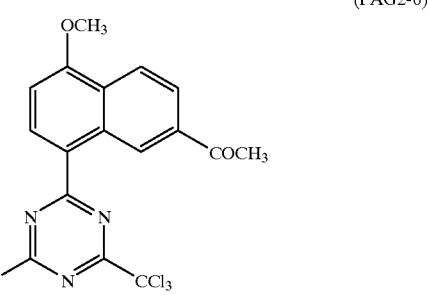
(PAG2-7)
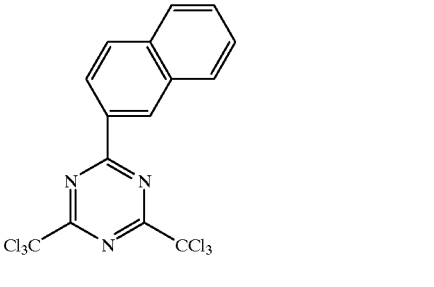

-continued

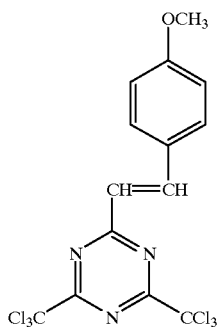
(PAG2-8)

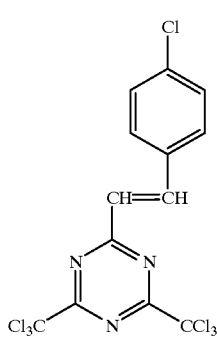
(PAG2-9)

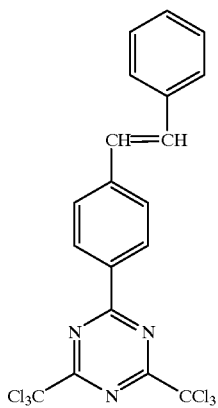
(PAG2-10)

(2) The iodonium salts represented by following formula (PAG 3) and the sulfonium salts represented by following formula (PAG 4)

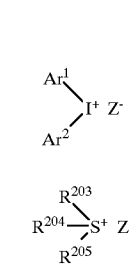
(PAG 3)

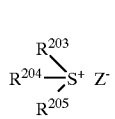
(PAG 4)

In the above formulae, $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group, and a halogen atom.

In the above formulae, $R^{203}$ $R^{204}$, and $R^{205}$ each independently represents a substituted or unsubstituted alkyl group or a substituted or unsubstituted aryl group, and is preferably an aryl group having from 6 to 14 carbon atoms and an alkyl group having from 1 to 8 carbon atoms, which may be substituted. Preferred examples of the substituent-include an alkoxy group having from 1 to 8 carbon atoms, an alkyl group having from 1 to 8 carbon atoms, a nitro group, a carboxyl group, a hydroxy group and a halogen atom for the aryl group, and an alkoxy group having from 1 to 8 carbon atoms, a carboxyl group and an alkoxycarbonyl group for the alkyl group.

In the above formulae, $Z^-$ represents a counter anion and shows a perfluoroalkaneslfonic acid anion such as $CF_3SO_3^-$ or a pentafluorobenzenesulfonic acid anion.

Also two of $R^{203}$, $R^{204}$, and $R^{205}$ and $Ar^1$ and $Ar^2$ may combine via a single bond or a substituent.

Specific examples of the above compounds are shown below but the compounds are not limited to these compounds.

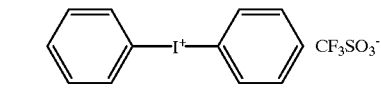
(PAG3-1)

(PAG3-2)

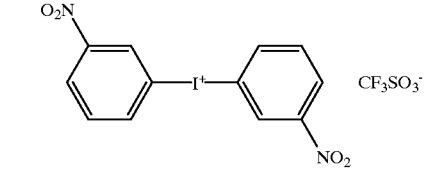
(PAG3-3)

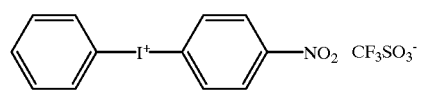
(PAG3-4)

(PAG3-5)
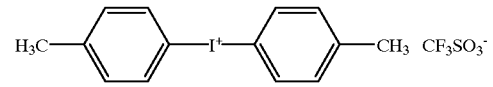

(PAG3-6)
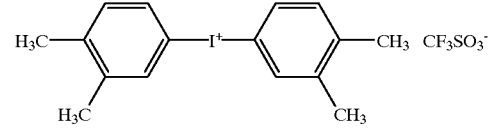

(PAG3-7)

(PAG3-8)
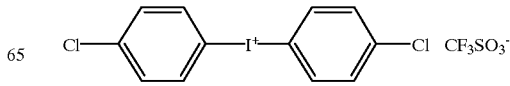

(PAG3-9)
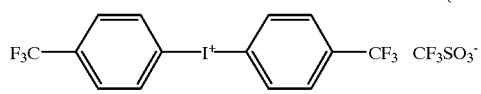
(PAG3-10)
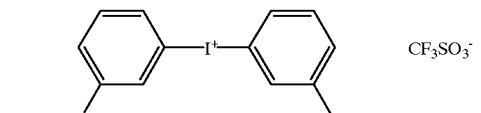
(PAG3-11)
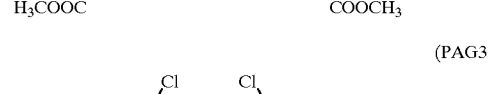
(PAG3-12)
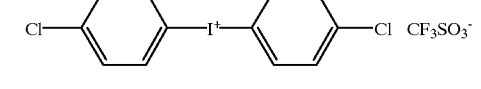
(PAG3-13)
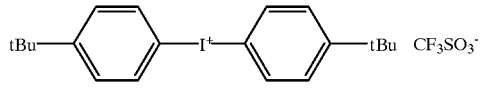
(PAG3-14)
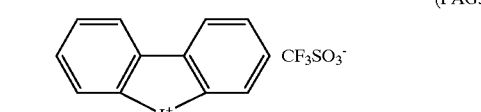
(PAG3-15)
(PAG3-16)
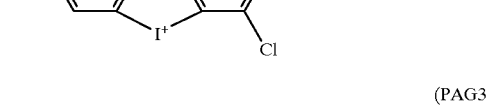
(PAG4-1)
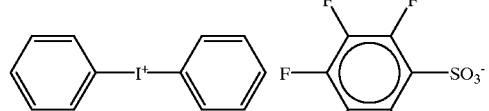
(PAG4-2)
(PAG4-3)
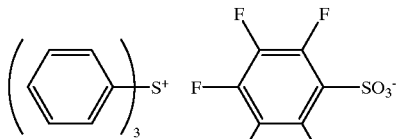
(PAG4-4)
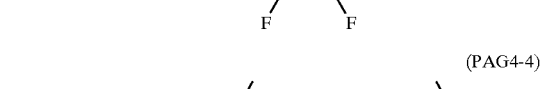
(PAG4-5)
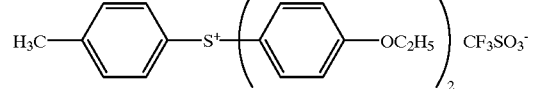
(PAG4-6)
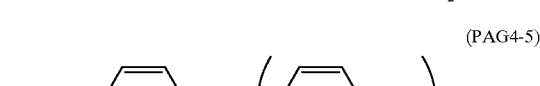
(PAG4-7)
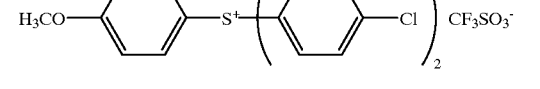
(PAG4-8)
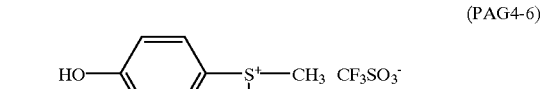
(PAG4-9)
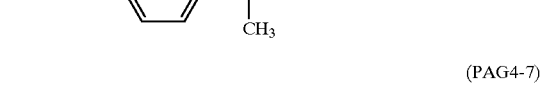
(PAG4-10)
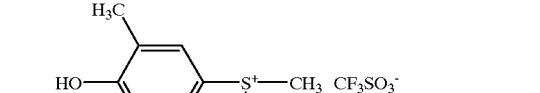
(PAG4-11)
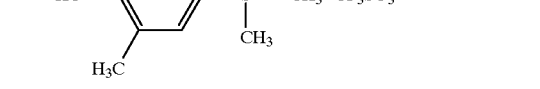

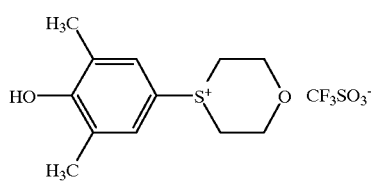 (PAG4-12)

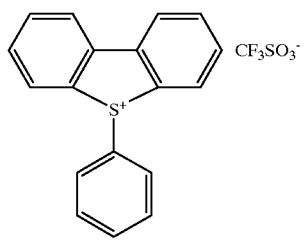 (PAG4-13)

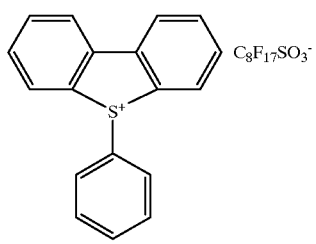 (PAG4-14)

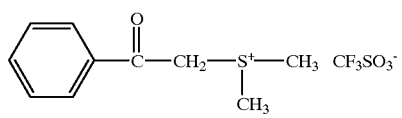 (PAG4-15)

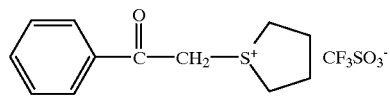 (PAG4-16)

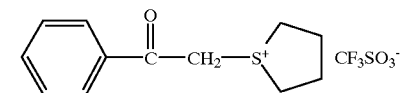 (PAG4-17)

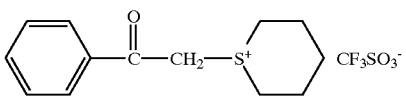 (PAG4-18)

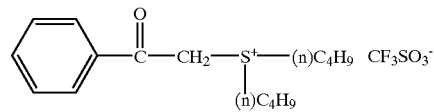 (PAG4-19)

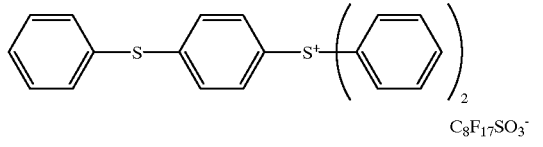 (PAG4-20)

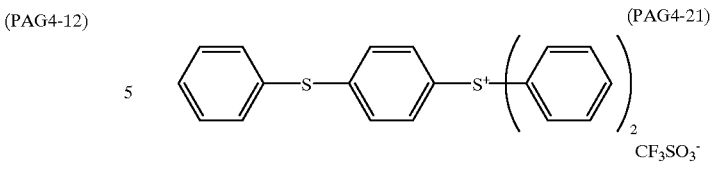 (PAG4-21)

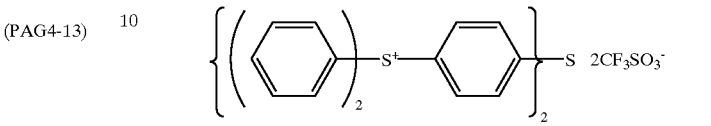 (PAG4-22)

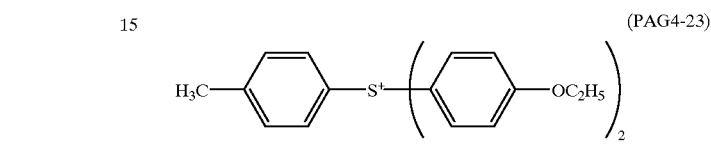 (PAG4-23)

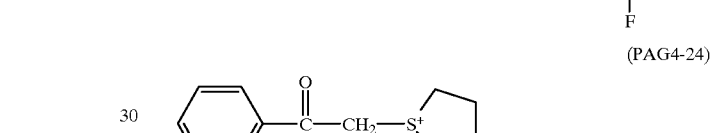 (PAG4-24)

The above-described onium salts shown by formulae (PAG 3) and (PAG 4) described above are known compounds and can be synthesized by the methods described, for example, in J. W. Knapczyk et al, *J. Am. Chem. Soc.*, 91, 145(1969), A. L. Maycok et al., *J. Org. Chem.*, 35, 2532 (1970), E. Goethas et al., *Bull. Soc. Chem. Belg.*, 73, 546(1964), H. M. Leicester, *J. Am. Chem. Soc.*, 51, 3587 (1929), J. V. Crivello et al., *J. Polym. Chem.* Ed. 18, 2677(1980), U.S. Pat. Nos. 2,807,648 and 4,247,473, and JP-A-53-101,331.

(3) The disulfone derivatives represented by following formula (PAG 5) and the iminosulfonate derivatives represented by following formula (PAG 6).

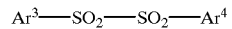 (PAG 5)

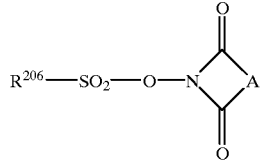 (PAG 6)

In the formulae, $Ar^3$ and $Ar^4$ each independently represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group, or a substituted or unsubstituted arylene group.

Specific examples of the above compounds are shown below but the above compounds are not limited to these compounds.

(PAG5-1)
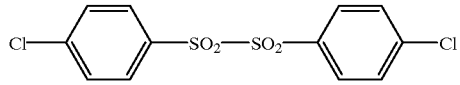

(PAG5-2)
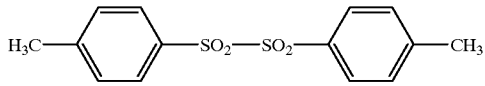

(PAG5-3)
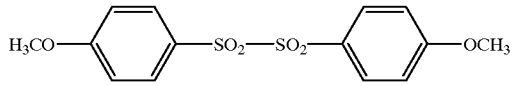

(PAG5-4)
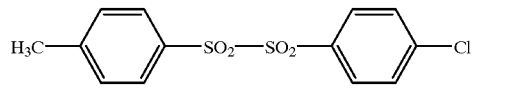

(PAG5-5)
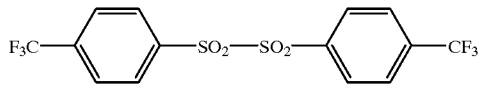

(PAG5-6)
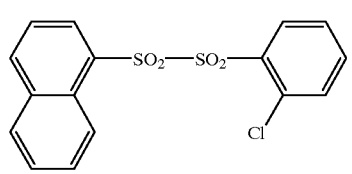

(PAG5-7)
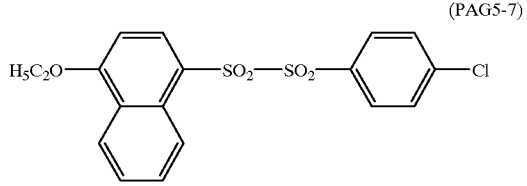

(PAG5-8)
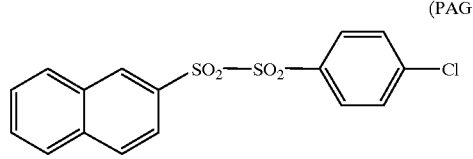

(PAG5-9)
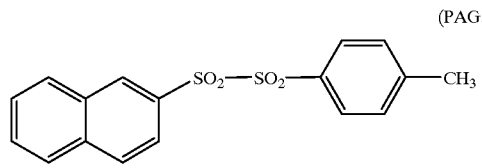

-continued (PAG5-10)
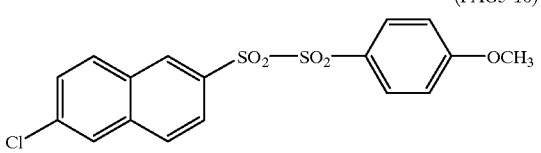

(PAG5-11)
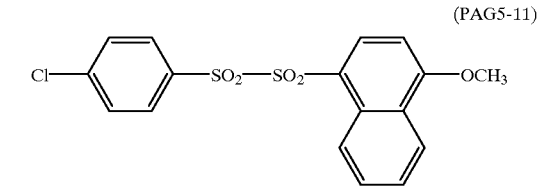

(PAG5-12)
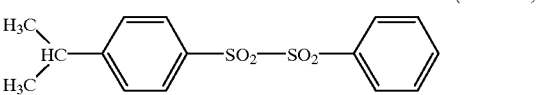

(PAG5-13)
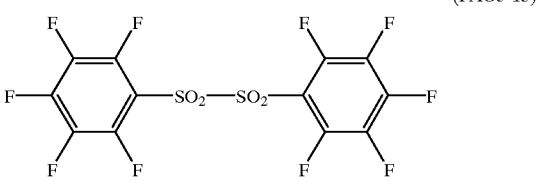

(PAG5-14)
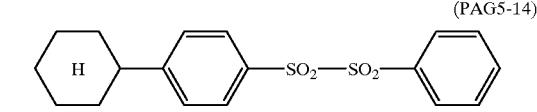

(PAG6-1)
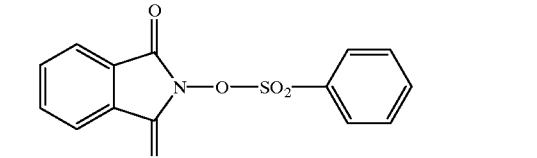

(PAG6-2)
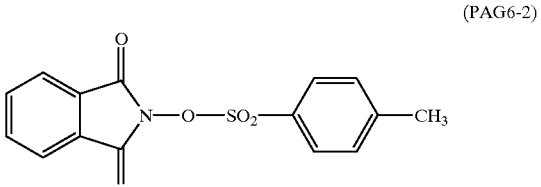

(PAG6-3)
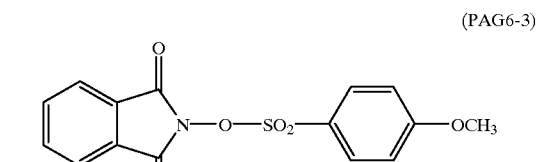

(PAG6-4)

-continued (PAG6-5)
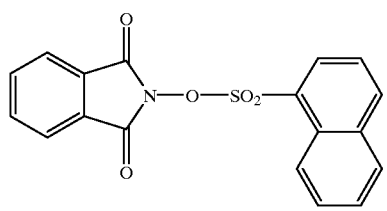

(PAG6-6)
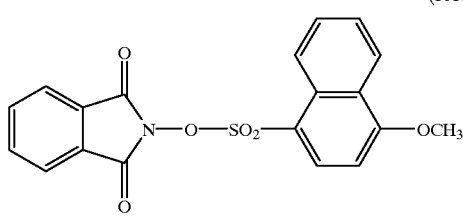

(PAG6-7)
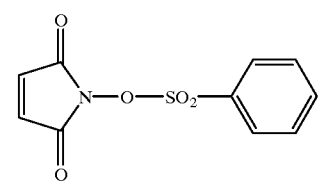

(PAG6-8)
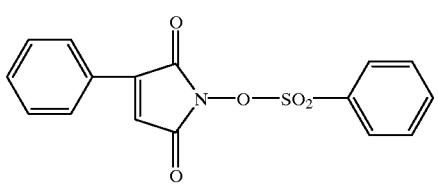

(PAG6-9)
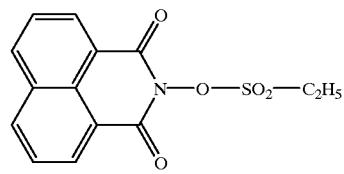

(PAG6-10)
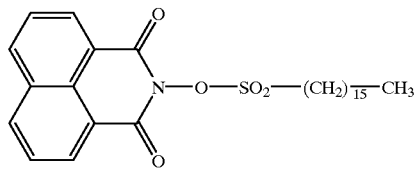

(PAG6-11)
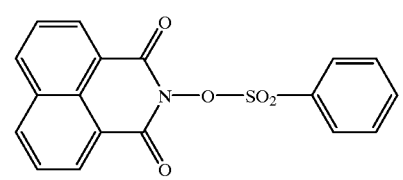

-continued (PAG6-12)
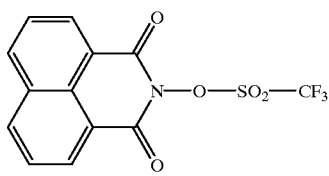

(PAG6-13)
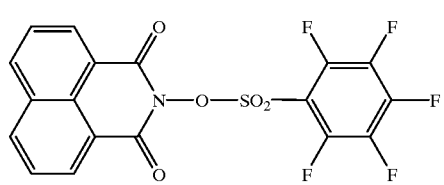

(PAG6-14)
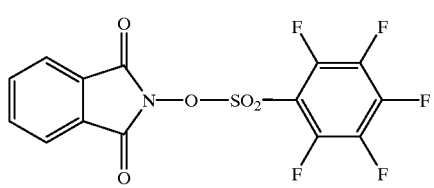

The resin having a substituent capable of increasing the solubility in an alkali developer by an acid is explained below. As the fundamental properties of the resin, the following properties are required.

(1) Transparency to the wavelength of the exposed light.

(2) Dry etching resistance.

(3) Solubility to a coating solvent.

(4) Appropriate glass transition temperature.

As a binder resin for a resist, a novolac resin and a styrene series resin such as parahydroxystyrene, have hitherto been used. The reason is because the aromatic ring contributes to a high dry etching resistance. However, since such resins have a high absorption to the light for exposure to be used in the present invention, which is originated in the aromatic ring, these materials can not be used. That is, the dry etching resistance must be ensured using non-aromatic series materials. The above-described properties (1) and (2) can be attained by skillfully using a compound having an alicyclic alkyl group at the side chains.

The resins having a substituent capable of increasing the solubility to an alkali developer by an acid are shown below. The ratio of each monomer unit is by mole.

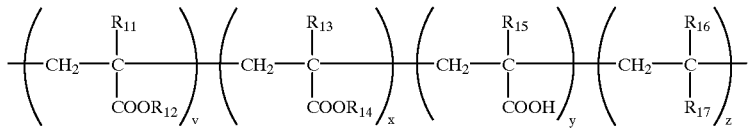

wherein, $R_{11}$, $R_{13}$, $R_{15}$, and $R_{16}$, which may be the same or different, each represents a hydrogen atom or a methyl group; $R_{12}$ represents

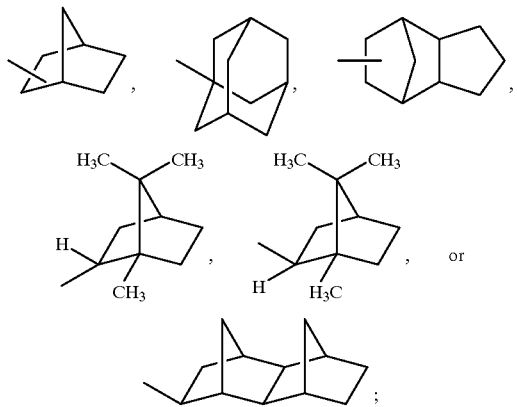

$R_{14}$ represents

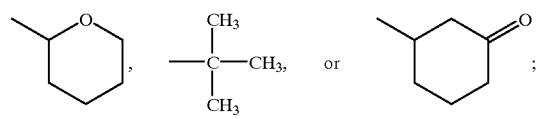

$R_{17}$ represents $COOCH_3$, $COOC_2H_5$, or $CN$;

v represents from 0.3 to 0.7; x represents from 0.2 to 0.6; y represents from 0.05 to 0.3; z represents from 0 to 0.2; and v+x+y+z=1. v, x, y and z indicate the molar ratio of each monomer unit.

Also, the resins each having introduced into the linking portions of the side chains an alicyclic compound as described below can be used as the resin having a substituent capable of increasing the solubility to an alkali developer by an acid in the present invention.

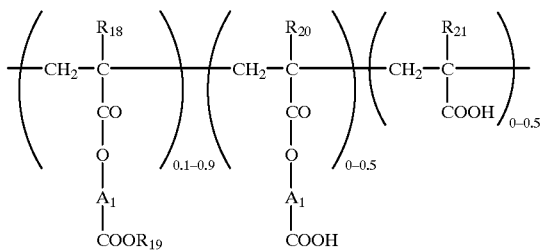

wherein, $R_{18}$, $R_{20}$, and $R_{21}$, which may be the same or different, each represents a hydrogen atom or a methyl group;

$R_{19}$ represents

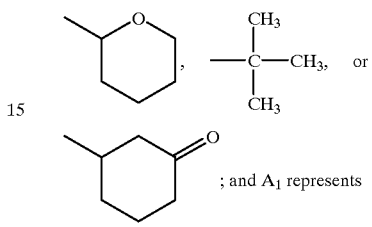

; and $A_1$ represents

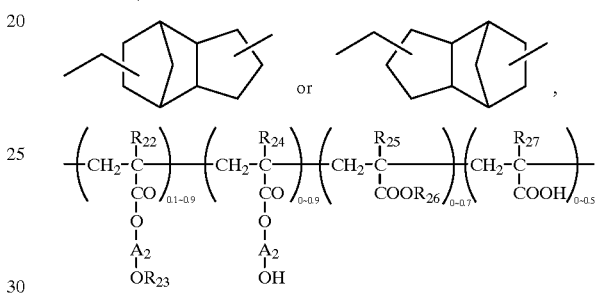

wherein $R_{22}$, $R_{24}$, $R_{25}$, and $R_{27}$, which may be the same or different, each represents a hydrogen atom or a methyl group; $R_{23}$ and $R_{26}$, which may be the same or different, each represents a tert-butoxycarbonyl group, a tetrahydrofuran-2-yl group, a 4-methoxytetrahydropyranyl group, a 3-oxocyclohexyl group, a 1-methoxyethyl group, a 1-ethoxyethyl group, a 1-isopropoxyethyl group, a 1-(n-butoxy)ethyl group, or a 1-(tert-butoxy)ethyl group; and $A_2$ represents

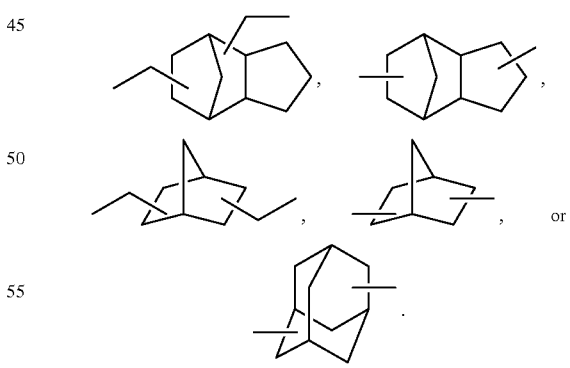

Furthermore, the resins each having introduced into the main chain portion an alicyclic compound can be used as the resin having a substituent capable of increasing the solubility to an alkali developer by an acid in the present invention, For example, there are resins having the following monomer unit but the resins are not limited to them.

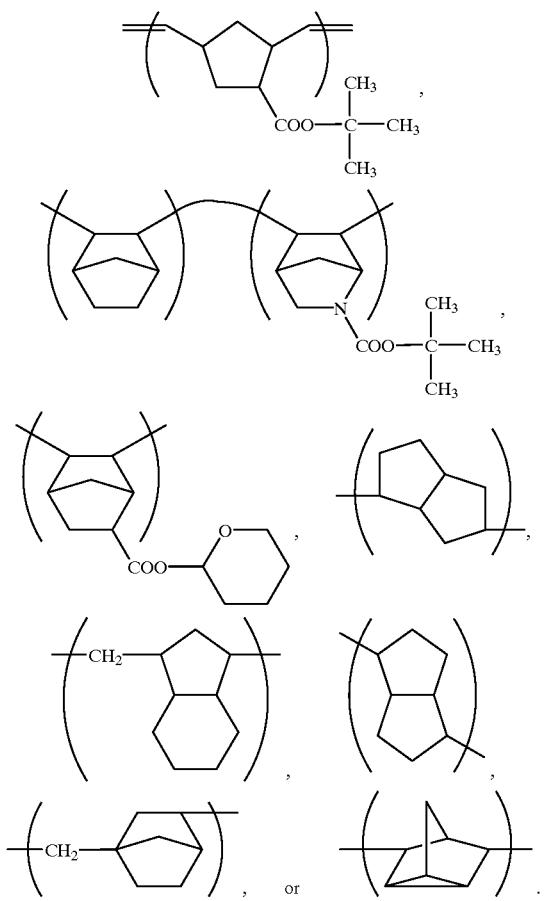

The above-described resins can be prepared by subjecting suitable monomers to radical polymerization in the presence of a radical polymerization initiator such as peroxides and azo type compounds. It is preferred that the resins have a weight average molecular weight of 2,000 to 200,000. If the weight average molecular weight is less than 2,000, the resistance to dry etching and heat may be deteriorated. On the other hand, if it exceeds 200,000, the developability or film-forming properties may be deteriorated. The deterioration of film-forming properties appears to be caused by the high viscosity.

In the present invention, the content of the resin having a substituent capable of increasing the solubility to an alkali developer by an acid in the composition is preferably from 40% by weight to 98% by weight and more preferably from 50% by weight to 95% by weight based on the total solid components.

To the photosensitive resin composition of the present invention nay be added an appropriate alkali-soluble low-molecular compound for the purpose of improving the alkali solubility of the system and for the purposes of controlling the glass transition temperature of the system and preventing the film from becoming brittle and the heat resistance from being deteriorated.

The alkali-soluble low-molecular compound includes the compounds having an acid group in the molecule, such as a dialkylsulfonamide compound, a dialkylsulfonylimide (—SO$_2$—NH—CO—) compound, and a dialkyldisulfonylimide (—SO$_2$—NH—SO$_2$—) compound. The content of the alkali-soluble low-molecular compound is preferably 40% by weight or less, more preferably 30% by weight or less, and still more preferably 25% by weight or less to the resin having a substituent capable of increasing the solubility to an alkali developer by an acid described above.

As the solvent, any organic solvents can be used in the present invention, as long as the components constituting the composition such as the resin and photo acid generator are sufficiently dissolved therein and the resulting solution can form a uniform coated film by a spin coating method etc. The organic solvents may be used singly or as a mixture thereof.

Examples of the solvent include n-propyl alcohol, isopropyl alcohol, n-butyl alcohol, tert-butyl alcohol, methylcellosolve acetate, ethylcellosolve acetate, propylene glycol monoethyl ether acetate, methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidinone, cyclohexanone, cyclopentanone, cyclohexanol, methyl ethyl ketone, 1,4-dioxane, ethylene glycol monomethyl ether, ethylene glycol monomehyl ether acetate, ethylene glycol monoethyl ether, ethylene glycol monoisopropyl ether, diethylene glycol monomethyl ether, and diethylene glycol dimethyl ether. As a matter of course, the organic solvents which can be used in the present invention are not limited to these.

Also, the fundamental constituting components of the photosensitive resin composition of the present invention are the N-hydroxyimidosulfonate compound, the resin, and the solvent (if necessary, the alkali-soluble low-molecular compound) described above but if necessary, other components such as a surface active agent, a dye, a stabilizer, a coatability improving agent and a dyestuff, may be added to the composition.

Examples of the developer which can be used in forming the fine patterns using the photosensitive resin composition of the present invention include an appropriate organic solvent, a mixture of such organic solvents, an alkali solution having an appropriate concentration, an aqueous solution, a mixture thereof, and a mixture of an alkali solution, an appropriate organic compound, and/or an organic solvent, which can be selected according to the solubility of the high-molecular compound used.

Suitable examples of the organic solvent and organic compound include ketones such as acetone, methyl ethyl ketone, methyl isobutyl ketone, cyclopentanone, cyclohexanone, 2,6-dimethylcyclohexanone, and 3-methyl-2-cyclopentanone; alcohols such as methyl alcohol, ethyl alcohol, n-propyl alcohol, isopropyl alcohol, n-butyl alcohol, isobutyl alcohol, tert-butyl alcohol, cyclopentanol, cyclohexanol, 2-methylcyclohexanol, 3-methylcyclohexanol, 3, 5-dimethylcyclohexanol, 1,4-cyclohexanedimethanol, and 1,4-cyclohexanediol; and other organic solvents such as tetrahydrofuran, dioxane, ethyl acetate, butyl acetate, isoamyl acetate, benzene, toluene, xylene, phenol, acetonitrile, and dimethyl formamide.

Suitable examples of the alkali solution include an aqueous solution, an organic solvent, and a mixture thereof containing an inorganic alkali (e.g., sodium hydroxide, potassium hydroxide, sodium silicate, and ammonia); an organic amine (e.g., ethylamine, propylamine, diethylamine, dipropylamine, trimethylamine, and triethylamine; or an organic ammonium salt (e.g., tetramethylammonium hydroxide, tetraethylammonium hydroxide, trimethylhydroxymethylammonium hydroxide, triethylhydroxymethylammonium hydroxide, and trimethylhydroxyethylammonium hydroxide).

The photosensitive resin composition of the present invention is dissolved in an appropriate solvent as described above and coated on a substrate to form a thin film. The thickness of the thin film is preferably from 0.4 to 1.5 µm.

With respect to a means of exposing, any means can be used as long as the light for exposure has a wavelength falling within the range of from 170 to 220 nm. An ArF excimer laser stepper is particularly preferred.

EXAMPLES

The present invention is explained practically by the following example but the present invention is not limited to the example.

(1) Synthesis of Compound (I-1)

In a four-neck flask equipped with a reflux condenser, a thermometer, a dropping apparatus, and a stirrer were placed 28.4 g of N-hydroxyamine (hydrochloride) and 100 ml of distilled water and an aqueous solution prepared by dissolving 15.8 g of sodium hydroxide in 50 ml of distilled water was added dropwise to the mixture over a period of 20 minutes. Thereafter, 50 g of methyl-substituted maleic anhydride was added to the mixture and after stirring the resultant mixture for 3 hours at room temperature, the mixture was stirred under heating for further 3 hours under a reflux condition. After the reaction was over, an aqueous solution of hydrochloric acid was added to the reaction mixture and after further saturating with sodium chloride, the product was extracted with ethyl acetate. The ethyl acetate solution obtained was concentrated to provide the crude crystals of the N-hydroxyimide product of methyl-substituted maleic anhydride. The crude crystals were recrystallized from toluene to provide 32 g of the crystals of the N-hydroxyimide product of methyl-substituted maleic anhydride.

Then, in the same apparatus as above were placed 5 g of the N-hydroxyimide product of methyl-substituted maleic anhydride obtained above, 6 g of trifluoromethanesulfonic acid sulfonylchloride, and 100 ml of acetone followed by stirring, 3,76 g of triethylamine was added dropwise to the mixture over a period of 30 minutes, and the resultant mixture was stirred for one hour at room temperature. The reaction mixture obtained was crystallized in distilled water and the powders thus deposited were collected by filtration to provide 8.8 g of the desired compound (I-1).

In addition, by changing the acid anhydride as the raw material, Compounds (I-2) and (I-3) could be obtained by the same procedure as above.

(2) Synthesis of Compound (I-9)

By reacting the N-hydroxyimide product of methyl-substituted maleic anhydride and camphor sulfonylchloride in place of trifluoromethanesulfonic acid sulfonyl chloride according to the above-described manners, the desired compound (I-9) was obtained.

(3) Measurement of Optical Absorption

In 4.5 g of propylene glycol monomethyl ether acetate were dissolved 0.2 mmol of each of the photo acid generator obtained in the above-described synthetic examples, N-hydroxysuccinimidotrifluoromethane sulfonate, or N-hydroxyphthalimidotrifluoromethane sulfonate and 1 g of a methacrylic acid-methyl methacrylate copolymer, each solution was filtered with a filter of 0.2 µm, each solution obtained was uniformly coated on a quartz glass plate, and dried for 90 seconds at 100° C. to form each film. The absorption of light having a wavelength of 193 nm by the film formed was measured by a ultraviolet absorption measurement apparatus to obtain the optical density of the film. The results obtained are shown in Table 1 below.

TABLE 1

| Photo Acid Generator | Optical Density ($\mu m^{-1}$) |
|---|---|
| (I-1) | 0.210 |
| (I-2) | 0.222 |
| (I-3) | 0.230 |
| (I-9) | 0.215 |
| N-Hydroxysuccinimidotrifluoromethane sulfonate | 0.254 |
| N-Hydroxyphthalimidotrifluoromethane sulfonate | 0.850 |

From the results, it can be seen that N-hydroxyphthalimidotrifluoromethane sulfonate had a particularly high optical absorption and was hard to be used for the lithography using the exposure light having a wavelength of 193 nm.

Also, it can be seen that in regard to the photo acid generator of the present invention and N-hydroxysuccinimidotrifluoromethane sulfonate, the transparency to the exposed light was high.

(4) Comparison of Acid Generating Efficiency 0.41 g of the photo acid generator (I-1) of this invention or 0.45 g of N-hydroxysuccinimidotrifluoromethane sulfonate with 10 g of a t-butyl methacrylate-methyl methacrylate-acrolein copolymer (copolymerization ratio:30/40/30) and 40 g of propylene glycol monomethyl ether acetate were mixed, followed by dissolving, and each solution was filtered by a filter of 0.2 µm to provide each resist liquid. The resist liquid was coated on a silicon wafer using a spin coater and dried for 90 seconds at 120° C. to form each resist film.

The resist film was exposed with a light of 172 nm, immediately after the exposure, the resist film was heated at 110° C. for 60 seconds, the silicon wafer having the resist film was immediately immersed in an aqueous solution of 2.38% tetramethylammonium hydroxide for 60 seconds, rinsed with water for 30 seconds, and dried.

From the ratio of residual film of the pattern on the silicon wafer thus obtained, the samples were compared in terms of sensitivity. Because the same acid was generated from the comparative photo acid generator, the sensitivity of the resist becomes an indicator of the acid generating efficiency of the photo acid generator. The sensitivity of the resist containing the comparative photo acid generator, N-hydroxysuccinimidotrifluoromethane sulfonate was taken as 100, and the relative sensitivity (exposure amount) was employed. If the relative sensitivity is less than 100, it has higher sensitivity and higher acid generating ratio. The results are shown in Table 2 below.

TABLE 2

| Photo Acid Generator | Relative Sensitivity |
|---|---|
| (I-1) | 70 |
| N-Hydroxysuccinimidotrifluoromethane sulfonate | 100 |

As shown in the above results, it can be seen that the photo acid generator of the present invention had a higher acid generating efficiency.

As described above, the photosensitive resin composition of the present invention for far-ultraviolet exposure of the present invention containing the specific photo acid generator has a high transparency to the light having wavelengths of from 170 to 220 nm and shows a high photo acid generating efficiency when exposed by the light having the foregoing wavelengths. Accordingly, the photosensitive resin composition of the present invention is suitably used as the material for the lithography using light having a wavelength of from 170 to 220 nm for exposure.

While the invention has been described in detail and with reference to specific embodiments thereof, it will be apparent to one skilled in the art that various changes and modifications can be made therein without departing from the spirit and scope thereof.

What is claimed is:

1. A pattern forming method, which comprises:

forming a thin film of a photosensitive resin composition on a substrate, light-exposing the thin film with an ArF excimer laser, and developing the exposed thin film, said photosensitive resin composition comprising a non-aromatic series resin having a substituent capable of increasing the solubility of the resin in an alkali developer by an acid and an N-hydroxymaleinimide sulfonate photo acid generator represented by formula (I):

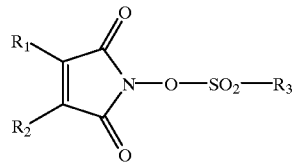

wherein $R_1$ and $R_2$, which may be the same or different, each represents a hydrogen atom, an alkyl group having from 1 to 6 carbon atoms, or a cycloalkyl group having not more than 6 carbon atoms; $R_1$ and $R_2$ may combine via an alkylene chain to form a ring; and $R_3$ represents an alkyl group, a perfluoroalkyl group, a cyclic alkyl group, or a camphor group, wherein the resin has an alicyclic alkyl group in the side chains.

2. The pattern forming method of claim 1, wherein the composition contains the photo acid generator represented by formula (I) in an amount of from 0.1 to 20% by weight based on the total solid components of the composition.

3. The pattern forming method of claim 1, wherein the composition contains the resin having a substituent capable of increasing the solubility of the resin in an alkali developer by an acid in an amount of from 40% by weight to 98% by weight based on the total solid components of the composition.

* * * * *